United States Patent [19]

Wouters et al.

[11] 4,158,824
[45] Jun. 19, 1979

[54] MULTI-NODE IMMITTANCE NETWORK

[75] Inventors: Joannes C. A. M. Wouters, Schoten; Hugo F. J. Witters, Berlaar, both of Belgium

[73] Assignee: International Standard Electric Corporation, New York, N.Y.

[21] Appl. No.: 830,007

[22] Filed: Sep. 1, 1977

[51] Int. Cl.² .......................................... H03H 11/00
[52] U.S. Cl. .................................. 333/213; 307/230; 307/295; 330/109
[58] Field of Search .................. 330/109, 302, 303; 333/80 R, 80 T; 307/230, 295

[56] References Cited
U.S. PATENT DOCUMENTS

| | | | |
|---|---|---|---|
| 3,805,178 | 4/1974 | Rollett | 330/109 X |
| 3,831,117 | 8/1974 | Fletcher | 307/320 X |
| 3,990,025 | 11/1976 | Lee | 333/80 R |
| 3,999,154 | 12/1976 | Schmidt | 333/80 R |

Primary Examiner—Paul L. Gensler
Attorney, Agent, or Firm—John T. O'Halloran; Alfred C. Hill

[57] ABSTRACT

A supercapacitance element is disclosed having the input signal applied to both the inverting and non-inverting inputs of a single operational amplifier via two respective potentiometers made up of resistors except for the branch between the inverting input and the ungrounded input terminal which is constituted by a capacitor. The amplifier output is resistively connected to the inverting input of the amplifier and capacitively connected to the ungrounded input terminal.

9 Claims, 1 Drawing Figure

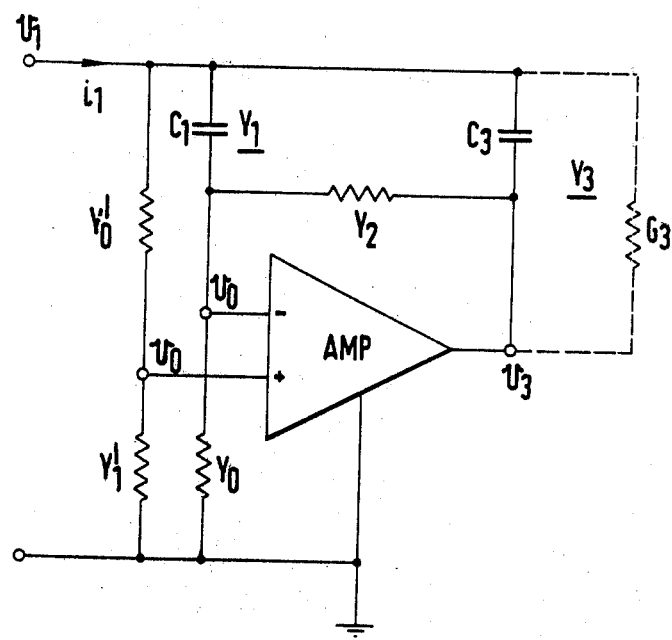

MULTI-NODE IMMITTANCE NETWORK

BACKGROUND OF THE INVENTION

The invention relates to a multi-node immittance network producing between the input nodes an immittance with a real component proportional to the square of the frequency.

Networks of this type were first disclosed by L. T. Bruton, e.g. Proceedings of the IEEE, August 1968, pages 1378/9, "Frequency Selectivity Using Positive Impedance Converter-type Networks" and IEEE Transactions on Circuit Theory, August 1969, pages 406 to 408, "Network Transfer Functions Using The Concept Of Frequency-Dependent Negative Resistance". More particularly, such networks can produce a real negative admittance proportional to the square of the frequency and such elements may have various applications, e.g. in filters, oscillators, etc., since they represent yet another way to avoid physical inductances in the realization of various immittance networks.

In telecommunication filters, for instance, it was previously known to replace physical inductances in a filter design by active circuits simulating the latter and, more particularly, a capacitively loaded gyrator which is equivalent to an inductance. However, when the filter inductances are in a series branch or more generally are floating elements with no grounded terminal, the realization using gyrators, for instance, is awkward and relatively costly since an ungrounded inductor must be simulated by two gyrators and with current operational amplifier solutions. In this solution each of the gyrators need two operational amplifiers making a total of four operational amplifiers for the simulated ungrounded inductance.

With Bruton filters, however, starting from a conventional LCR filter design, an impedance transformation is used in such a way that multiplying all the elements by a common scaling factor inversely proportional to the frequency, all resistances become capacitances, all inductances are transformed into resistances and finally all capacitances become FDNR (Frequency-Dependent Negative Resistances) elements of Bruton or so-called supercapacitances, i.e. negative conductances proportional to the square of the frequency. Such supercapacitances can be realized, like gyrators and other similar impedance converters or inverters, by using operational amplifiers and in a low-pass filter using original grounded capacitances only, the Bruton concept is particularly attractive since these will be replaced by grounded super capacitances which need only two operational amplifiers, all the remaining elements of the transformed filter being resistances and capacitances, the latter corresponding to the original source and load resistances for the filter.

Nevertheless, two operational amplifiers are still needed per supercapacitance, even when the latter is grounded, and a general object of the present invention is to reduce this to a single operational amplifier.

SUMMARY OF THE INVENTION

In accordance with a characteristic of the invention, a multi-node immittance network as initially described is characterized in that it includes a single operational amplifier with its output connected to its inverting input and to one of the input nodes via respective admittances and with its inverting and non-inverting inputs connected to at least one of the input nodes via further respective admittances.

In this manner, it can be shown that the input admittance can include a conductance term proportional to the square of the frequency and, more particularly, using only resistances and two capacitances in association with the single operational amplifier, a supercapacitance as disclosed by Bruton is realized. Such a basic circuit produces also an additional admittance term independent of the frequency, as well as yet a third admittance term proportional to the frequency. More particularly, this last can be either a positive or a negative admittance with the result that by a suitable choice of the values of the elements, it can be cancelled leaving only a supercapacitance in parallel with the conductance. Moreover, it is also possible to design the circuit in order to have a positive or negative value for this parallel conductance, and to cancel it if desirable for the application in view.

Having now described the essential characteristics of the supercapacitance in accordance with the invention as compared to those of the prior art, in brief, a preferred embodiment of the invention for such a supercapacitance, particularly one of the grounded type, consists in applying the input signal both to the inverting and to the non-inverting inputs of a single operational amplifier via two respective potentiometers made out of resistors except for the branch between the inverting input and the ungrounded input terminal which is constituted by a capacitor. Additionally, the output of the amplifier is resistively connected to the inverting input and capacitively connected to the ungrounded input.

BRIEF DESCRIPTION OF THE DRAWING

The above and other objects and features of the invention as well as the best manner of attaining them will be better understood and the invention itself best appreciated from the following detailed description of a preferred embodiment of the invention to be taken in conjunction with the accompanying drawing, the single FIGURE of which is a schematic circuit diagram of a supercapacitance circuit using a single operational amplifier.

DESCRIPTION OF THE PREFERRED EMBODIMENT

As shown, one of the input terminals is grounded and the input signal voltage $v_1$ appearing at the other terminal is coupled to the positive non-inverting input of operational amplifier AMP via admittance $Y'_0$, shown as a resistor, a potentiometer to ground involving this element being formed by the additional admittance $Y'_1$, shown as a resistor between this non-inverting input and ground. The circuit input is also connected via a potentiometer to the inverting negative input of amplifier AMP but while the latter is connected to ground via admittance $Y_0$ which is again shown as a resistance, it is coupled to the $v_1$ input terminal via admittance $Y_1$, shown as capacitor $C_1$. Finally, the output terminal of amplifier AMP, where the output signal voltage $v_3$ appears, is connected to the negative inverting input of amplifier AMP through resistive admittance $Y_2$ and to the input terminal, where $v_1$ is applied, through admittance $Y_3$ shown here as capacitance $C_3$ with eventually a conductance $G_3$ in shunt therewith as shown by the corresponding connections in dotted lines.

It is a characteristic of an operational amplifier that both input signal voltages being very small with respect to the output signal voltage $v_3$, in view of the high gain of the amplifier, for the purpose of analysing the circuit, one may assume that both the inverting and the non-inverting inputs of amplifier AMP are at the same signal voltage $v_0$ as indicated. In such a case, and moreover assuming also in conventional manner that the impedances at the two $v_0$ nodes, looking into amplifier AMP can be considered as infinitely high, conventional circuit analysis produces the input admittance $i_1/v_1$, where $i_1$ is the input signal current, as $$\frac{i_1}{v_1} = \frac{Y_1 Y_2 (Y_0 + Y_1) + (Y_1 Y_2 + Y_1 Y_1 - Y_0 Y_0) Y_3}{(Y_0 + Y_1) Y_2} \quad (1)$$

If one now has $$Y_1 = pC_1 \quad (2)$$

$$Y_3 = pC_3 + G_3 \quad (3)$$

wherein p represents the complex angular frequency, by replacing $Y_1$ and $Y_3$ in equation (1) in terms of the above capacitances $C_1/C_3$ and the conductance $G_3$, one has $$\frac{i_1}{v_1} = \frac{p^2 C_1 C_3 Y_1 + p C_1 Y_1 (G_3 + Y_2) + p C_3 (Y_1 Y_2 - Y_0 Y_0) + G_3 (Y_1 Y_2 - Y_0 Y_0) + Y_0 Y_1 Y_2}{(Y_0 + Y_1) Y_2} \quad (4)$$

Considering this last equation, all terms except that in $p^2$, i.e. the supercapacitance, can be eliminated provided the following double relation is satisfied $$\left(\frac{Y_0}{Y_1}\right)\left(\frac{Y_0}{Y_2}\right) - 1 = \frac{C_1}{C_3}\left(1 + \frac{G_3}{Y_2}\right) = \frac{Y_0}{G_3} \quad (5)$$

These conditions are not particularly stringent and various degrees of freedom are left so that, for instance, the two capacitances $C_1$ and $C_3$ might be chosen of equal value and this could also be the case for the conductances $Y'_0$ and $Y'_1$.

Considering equations (4) and (5), it is also clear that the conductance $G_3$ shown in dotted line is only an essential element if it is desired to cancel the admittance term which does not depend of the frequency. If not, naturally the third and last member of the double equation (5), i.e. $Y'_0/G_3$, disappears and the second member of the remaining single equation now simply becomes $C_1/C_3$ since in the latter member $G_3$ can be equated to 0.

While ordinary operational amplifiers are based on the appearance of signal voltages at the inverting and non-inverting inputs, so-called Norton amplifiers have similar properties but such differential amplifiers are time based on differential current inputs. The invention is also applicable in such a case for which the preceding analysis is generally valid provided $Y_0$ and $Y'_1$ are assumed to be admittances of infinite value and that accordingly, the ratio $Y_0/Y'_1$ in the first member of equation (5) is equal to unity and disappears from this double equation.

While the principles of the invention have been described above in connection with specific apparatus, it is to be clearly understood that this description is made only by way of an example and not as a limitation on the scope of the invention.

We claim:

1. A multi-node immittance network producing between two input nodes an immittance with a real component proportional to the square of the frequency, one of said input nodes being ground, comprising:
   an operational amplifier having an inverting input, a non-inverting input and an output;
   a first admittance connected between said output and said inverting input;
   a second admittance connected directly between said output and the other of said input nodes;
   a third admittance connected between said non-inverting input and said other of said input nodes; and
   a fourth admittance connected between said inverting input and said other of said input nodes.
2. A network according to claim 1, wherein said second and fourth admittances are capacitive.
3. A network according to claim 2, wherein said first and third admittances are resistive.
4. A network according to claim 1, wherein said second admittance includes
   a capacitor, and
   a conductance connected in shunt relation to said capacitor.
5. A network according to claim 1, wherein said first and third admittances are resistive.
6. A network according to claim 1, wherein the values of said first, second, third and fourth admittances are selected so that said immittance is proportional to the square of the frequency.
7. A network according to claim 1, wherein said operational amplifier is a Norton amplifier.
8. A network according to claim 1, further including a fifth admittance connected between said non-inverting input and said one of said input nodes; and a sixth admittance connected between said inverting input and said one of said input nodes.
9. A network according to claim 8, wherein said fifth and sixth admittances are resistive.

* * * * *